United States Patent
Swan

(10) Patent No.: US 8,521,798 B2
(45) Date of Patent: Aug. 27, 2013

(54) SECOND ORDER REAL ALLPASS FILTER

(75) Inventor: Dean Swan, Canton, NY (US)

(73) Assignee: Magor Communications Corporation (CA)

(*) Notice: Subject to any disclaimer, the term of this patent is extended or adjusted under 35 U.S.C. 154(b) by 1374 days.

(21) Appl. No.: 12/235,101

(22) Filed: Sep. 22, 2008

(65) Prior Publication Data

US 2010/0077014 A1 Mar. 25, 2010

(51) Int. Cl.
*G06F 17/10* (2006.01)

(52) U.S. Cl.
USPC ............... 708/318; 708/300; 708/320

(58) Field of Classification Search
None
See application file for complete search history.

(56) References Cited

U.S. PATENT DOCUMENTS

| 4,864,526 A | * | 9/1989 | Dyer | 708/313 |
| 2002/0012389 A1 | * | 1/2002 | Wildhagen | 375/229 |

* cited by examiner

*Primary Examiner* — Michael D Yaary
(74) *Attorney, Agent, or Firm* — Laubscher & Laubscher, P.C.

(57) ABSTRACT

A digital all-pass filter has an input port leading to an input sum block and a first feed forward path. Within the first feed forward path is a multiplier. The filter also has an output port coupled to an output sum block that receives a signal from the first feed forward path. A first feedback path is also provided from the output port to the input sum block. The first feedback path includes a multiplier therein. Nested within this structure is a first order all-pass filter having a feed forward path including a forward path delay and forward path that is delayed and a feedback path absent a separate delay element and beginning after the forward path delay element.

2 Claims, 7 Drawing Sheets

SECOND ORDER REAL ALLPASS FILTER

FIELD OF THE INVENTION

The invention relates to all-pass filters and designing digital implementations thereof for digital signal processing.

BACKGROUND OF THE INVENTION

Digital signal processing (DSP) has become a common approach to processing signals within a wide variety of applications, even replacing analog signal processing completely in many applications. DSP applications include audio and speech signal processing, sonar and radar signal processing, sensor array processing, spectral estimation, statistical signal processing, digital image processing, signal processing for communications, biomedical signal processing, seismic data processing, etc. Typically in the past DSP algorithms were run on standard computers or on specialized processors called digital signal processors (DSPs), or on purpose-built hardware such as application-specific integrated circuit (ASICs). Today there are additional technologies used for digital signal processing including more powerful general purpose microprocessors, field-programmable gate arrays (FPGAs), digital signal controllers (mostly for industrial apps such as motor control), and stream processors, among others which are bringing DSP processing into many devices including consumer portable electronic devices.

A common function implemented with DSP is filtering. A special class of filters is all-pass filters. As opposed to passband, high pass and low pass filters. An all-pass filter is an electronic filter that passes all frequencies equally, but may change phase relationships between various frequencies. It does this by varying its propagation delay with frequency while maintaining signal amplitude. Generally, the filter is described by the frequency at which the phase shift reaches a predetermined value. For a first-order all pass filter this is 90°, whilst for a second order all-pass this is −180°. There are many known uses for digital all-pass filters.

In DSP processing of digital representations of signals within a digital computer, diametrically opposed demands which are difficult to satisfy simultaneously often exist. For instance, latency should be very small in order to enable real time processing of signals. Typically, this requires very fast processing to allow complex processing to be applied to broad bandwidth signals. In order to support faster processing of digital signals, either faster circuitry is used, increasing expense, or a simpler process is employed, typically providing significantly less quality performance. Simpler processes greatly limit options while greater costs affect a products acceptance.

As a result many researchers have sought to reduce computational complexity of all-pass filters for DSP applications. For example, Regalia et al (P. A. Regalia, S. K. Mitra, and P. P. Vaidyanathan; "The digital all-pass filter: A versatile signal processing building block", *Proc. of the IEEE*, 76(1):19-37, January 1988) use a normalized lattice according to the prior art. This approach implemented in a DSP all-pass filter required 2 unit delays, 8 multiplications, and 4 additions. Each multiplication and addition operation consuming processor cycles whilst unit delays require memory storage operations consuming memory, power and processor operations.

A modified approach employing a Gray-Markel lattice (see J.D. Markel & A.H. Gray, Jr. (1976), "Linear Prediction of Speech", Springer Verlag, Berlin) reduces the number of multiplications from 8 to 2 whilst increasing the number of additions from 4 to 6. Similarly Stilson (see Stilson, Timothy S., "Efficiently-Variable Non-Oversampled Algorithms in Virtual Analog Music Synthesis - A Root-Locus Perspective, Doctoral Thesis, Stanford University, Department of Electrical Engineering, June 2006, Appendix E - On the Classic Allpass Filter Forms, pp. 353-362) addressed the second-order all-pass filter using filter designs which are comparable to Direct-Form-1(DF1) and Transposed Direct-Form-2 (TDF2) designs, outlined below in respect of the invention, but they were still lattice filter designs. Stilson's two forms corresponding to forward and reverse lattice designs. The DF1-like design of Stilson reduces the number of multiplications compared to Regalia from 8 to 2 but increases the number of delays from 2 to 4. The TDF2-like design returns to only 2 delays but require 4 multiply operations and 4 add operations. Whilst for the first order filters, namely Direct Form (DF1 and DF2 respectively) and Transposed Direct Form (TDF1 and TDF2 respectively), the Stilson filters are equivalent they are not interchangeable. This however does not hold true for higher order filters.

TABLE 1

DSP Element Requirements of Prior Art Second-Order All-Pass Filters

| Type | Unit Delays (memory storage operations) | Multiplies | Adds |
|---|---|---|---|
| Regalia Normalized Lattice | 2 | 8 | 4 |
| Gray-Markel Lattice | 2 | 2 | 6 |
| Stilson DF1-like | 4 | 2 | 4 |
| Stilson TDF2-like | 2 | 4 | 4 |

Accordingly it would be beneficial to reduce the computational requirements of an all-pass filter further with respect to these prior art solutions.

SUMMARY OF THE INVENTION

In accordance with the invention there is provided a DSP process comprising: an input port having an input sum block coupled thereto; an output port having an output sum block coupled thereto; a first feed forward path between the input port and a second input port of the output sum block and having a first feed forward multiplier block disposed therein; a first feedback path form the output port to a second input port of the input sum block and having a first feedback multiplier block disposed therein; a nested filter input port coupled to an output port of the input sum block and coupled to an input port of a nested input sum block; a nested filter output sum block; a nested multiplier block disposed between an output port of the nested filter input sum block and a first input port of the nested filter output sum block; a nested feed forward path between the nested filter input port and a second input port of the nested filter output sum block, the first feed forward path comprising a nested feed forward delay block; a delay block disposed between an output port of the nested filter output sum block and a first input port of the output sum block; and a nested feedback path coupled between the first input port of the output sum block and a second input port of the nested filter input sum block.

In accordance with another embodiment of the invention there is provided a method of forming a digital filter comprising: providing a first nth order filter, n>=1; providing a second mth order filter, m>=1; and, nesting the first nth order filter within the second nth order filter and using a single delay element in the place of two resulting delay elements within the nested n+mth order filter, the two resulting delay elements each from a different one of the nth order filter and the mth order filter.

Preferably, a filter according to the invention is a digital all-pass filter.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figures 1A, 1B:
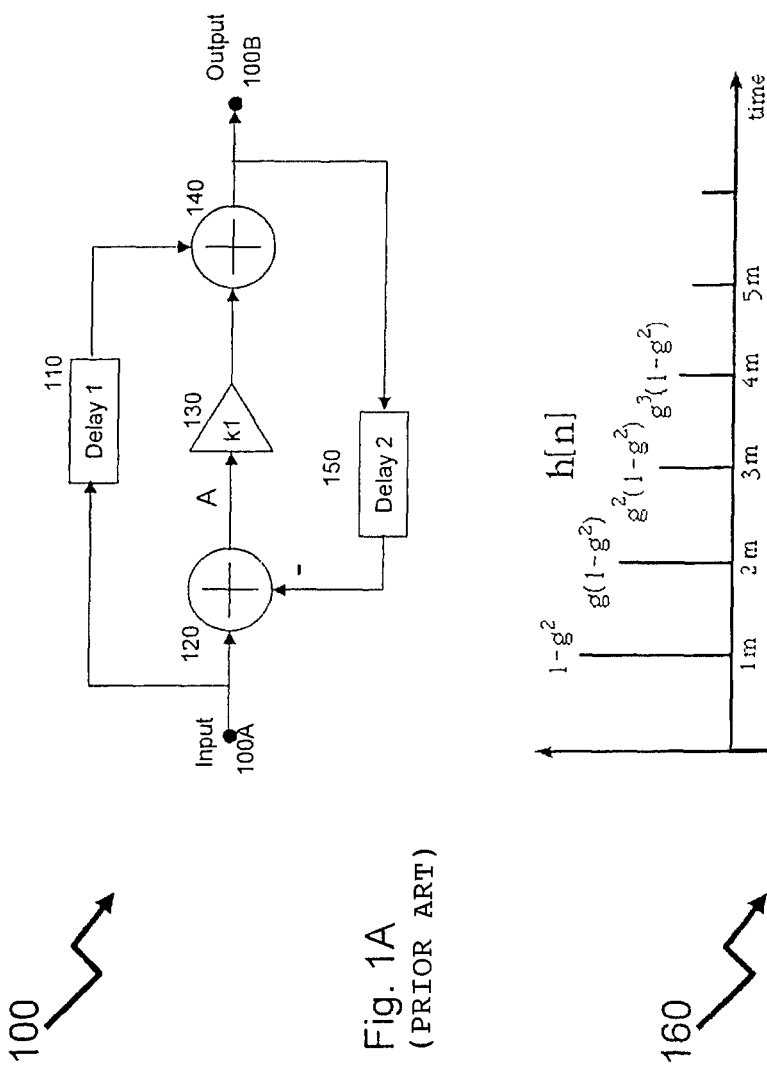
FIG. 1 is a block diagram for a direct form 1-like first order all-pass filter according to the prior art.

Referring to FIG. 1A there is illustrated a direct form 1-like (DF1-like) first order all-pass filter according to the prior art. Such a filter having a basic transfer function as shown below in Equation 1. If plotted upon a pole-zero plot then the poles and zeros occupy conjugate reciprocal locations.

$$H(z) = \frac{z^{-1} - a^*}{1 - az^{-1}} = \frac{1 - a*z}{z - a} \tag{1}$$

The proof that the frequency response is flat is shown below for complex signals in Equations 2a and 2b, $$H(e^{-j\omega}) = \frac{e^{-j\omega} - a^*}{1 - ae^{-j\omega}} \tag{2a}$$

$$= e^{-j\omega} \frac{1 - a*e^{j\omega}}{1 - ae^{-j\omega}} \tag{2b}$$

and for real signals it is usually written as shown below in Equation 3, $$H(z) = \frac{z^{-1} - a}{1 - az^{-1}}. \tag{3}$$

As shown by first order all-pass filter 100 of FIG. 1A there is an input port 100A which receives a digital signal to be processed. This signal is fed to first summation 120 and fed-forward to first delay 110, having delay Delay 1. The first output sum of the first summation circuit 120 is provided to first multiplication 130, by factor k1, the output product of which is summed with the signal fed forward through first delay 110 in second summation 140. The second output sum of the second summation 140 is fed to the output port 100B and to the first summation circuit via second delay 150, having delay Delay 2, for summation with the digital signal at port 100A at the delayed time period. Accordingly the first order all-pass filter 100 has an output value given by Equation 4 below.

$$\text{Output} = \text{Delay1} + (k1*(\text{Input} - \text{Delay2}))) \tag{4}$$

The impulse response for the first order all-pass filter 100 is shown in FIG. 1B by impulse plot 160 wherein magnitude of H[n] is plotted versus time.

Figure 2:
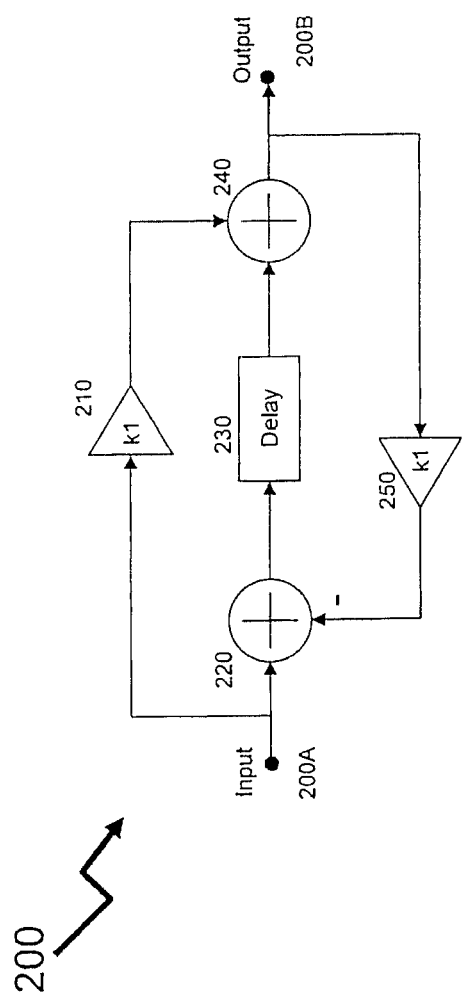
FIG. 2 is a block diagram for a transpose direct form II (TDF2) of the first order all-pass filter according to the prior art.

Referring to FIG. 2 there is shown a transpose direct form II (TDF2) implementation 200 of the first order all-pass filter 100 according to the prior art, wherein the output values provided at output port 200B is related to the input values provided to input port 200A by the relationship given in Equation 5. Structurally the transpose direct form implementation 200 couples a signal at the input port 200A to a first summation 220, and first multiplication 210 wherein the multiplication factor is k1. The first output sum of the first summation 220 is then delayed by delay 230 where it is summed with the first output product of the first multiplication 210 by second summation 240. The second output sum of second summation 240 is provided both to the output port 200B and to second multiplication 250 which applies a multiplication of −k1. The second output product from the second multiplication is coupled to the first summation 220.

$$\text{Output} = \text{Delay} + (k1*\text{Input})) \tag{5}$$

Figure 3:
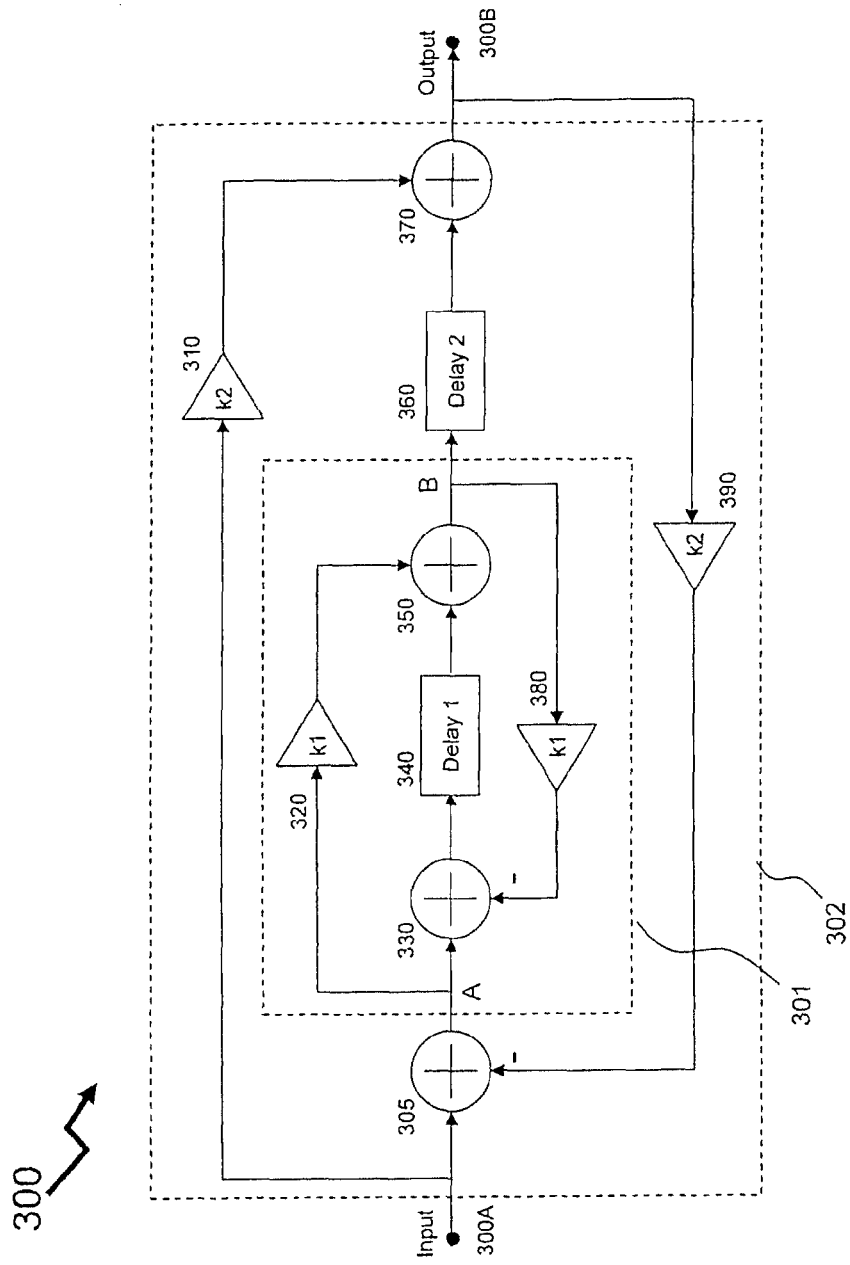
FIG. 3 is a block diagram for a second-order all-pass lattice filter according to the prior art employing TDF2 sections.

Now referring to FIG. 3 there is shown a second-order all-pass lattice filter 300 based upon transpose direct form II (TDF2) sections according to the prior art. Essentially second-order all-pass filter 300 comprises a TDF2 first order all-pass filter 301 embedded within a second TDF2 first order all pass filter 302. TDF2 first order all-pass filter 301 is essentially the same as TDF2 implementation 200 comprising first and second summations 330 and 350, first and second multiplications 320, 380 by factor k1, and delay 340 of Delay 1. The second TDF2 302 thereby comprises third and fourth summation circuits 305 and 370 respectively, third and fourth multiplications 310, 390 by factor k2, and second delay 360 of Delay 2. The TDF first order all-pass filter 301 being disposed between the third summation 305 and second delay 360. The second-order all-pass filter 300 having an overall operation from input port 300A to output port 300B given by Equation 7 below:

$$\text{Output} = \text{Delay2} + (k2*\text{Input})) \tag{7}$$

where A = Input −(k2* Output)), Delay2 = Delay1 +(k1* A), and Delay1 = A−[k1Delay2].

In terms of operations TDF second-order all-pass filter 300 comprises 2 delays, i.e. memory storage operations, 4 multiplications, and 4 additions as with a Stilson TDF2-like implementation discussed supra.

Figure 4:
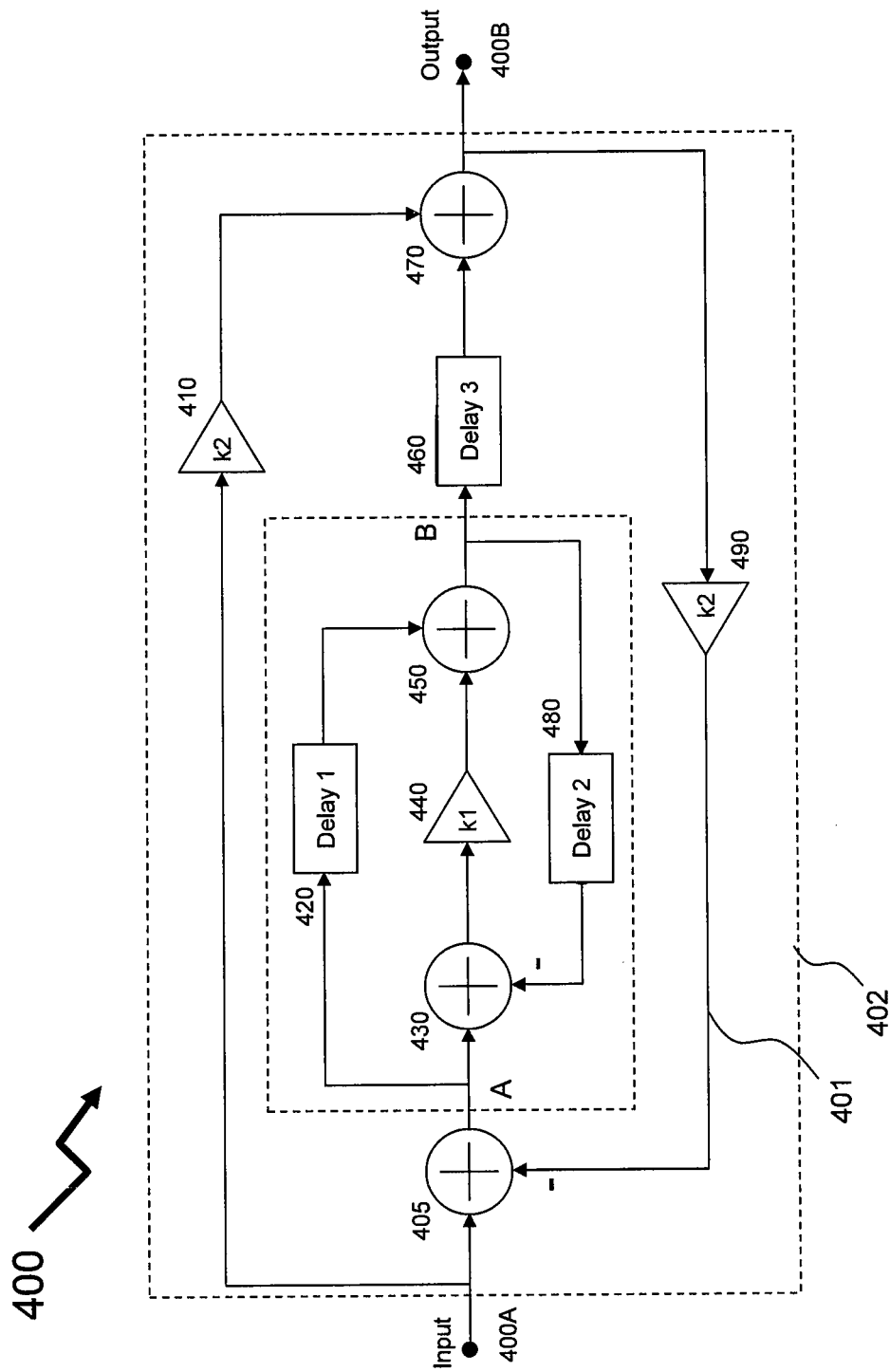
FIG. 4 is a block diagram for a second-order all-pass filter wherein a direct form 1-like first-order filter all-pass section is substituted for the nested TDF2 first-order all pass section of FIG. 3.

FIG. 4 illustrates a second-order all-pass filter 400 wherein a direct form-like (DF1) first-order section 401 is substituted for the nested TDF2 first-order all pass section 301 within the TDF2 second order all-pass filter 402. Accordingly the DF1 first-order section 401 comprises first and second summation circuits 430 and 450 disposed either side of first multiplier 440, and first and second delays 420, 480 of Delay 1 and Delay 2, respectively. The balance of the TDF2 second order all-pass filter 402 comprises third and fourth summation circuits 405 and 470, respectively, third delay 460 of Delay 3 coupled to the output port of the DF1 first-order section 401, and third multiplication of factors k2 410 and fourth multiplication of factor -k2 490. The TDF second-order all-pass filter 400 can have an overall operation from input port 400A to output port 400B given by Equation 8 below:

$$\text{Output} = \text{Delay3} + (k2 * \text{Input})) \quad (8)$$

where A=Input−($k2$*Output)), B =Delay1+($k1$*(A −Delay2)) Delay1=A , and Delay2=Delay3=B. Overall TDF second-order all-pass filter 400 comprises 4 summations, 3 multiplications and 3 delay operations.

Figure 5:
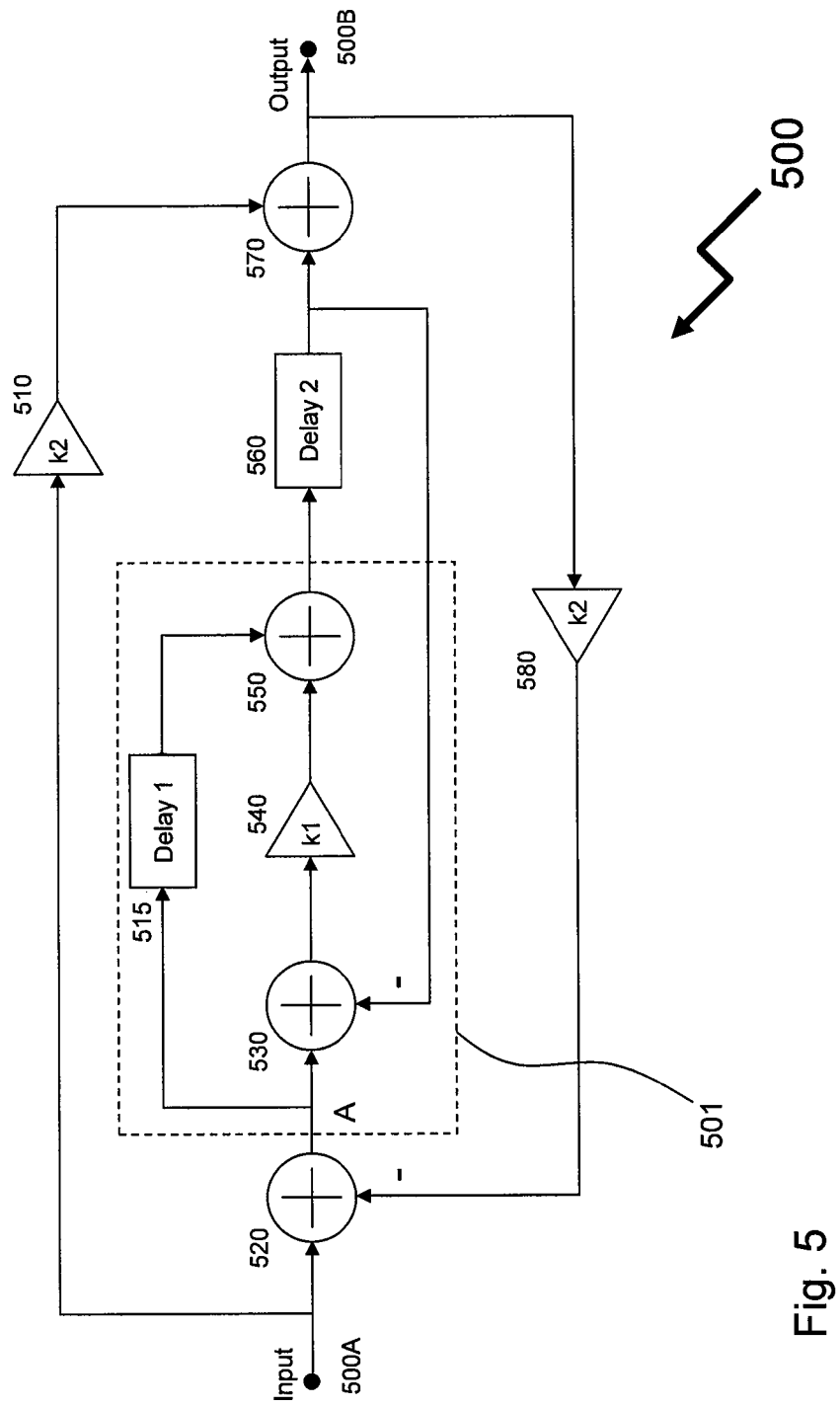
FIG. 5 is a block diagram for the second-order all-pass filter of FIG. 4 transformed according to an embodiment of the invention.

FIG. 5 illustrates a second-order all-pass filter 500 according to an embodiment of the invention wherein the second-order all-pass filter 400 has been transformed. As shown the structure initially appears to be similar to TDF second-order all-pass filter 400 of FIG. 4 but it is reduced significantly in that there are now only 2 delay operations. As noted supra delay operations consume memory, power, and processing, so the elimination of delay operations is beneficial to the overall functionality of a DSP implementation requiring a second-order all-pass filter operation. Accordingly, second-order all-pass filter 500 comprises an input summation 520 which combines the signal at the input port 500A with the multiplied output product of the second-order all-pass filter 500, the output product having been multiplied by a factor k2 by third multiplier 580. The first output sum of the first summation 520, denoted by A, is coupled to second summation 530 and fed-forward via first delay 515, applying a delay of Delay1 to the third summation 550.

The second summation combines the signal A with the fed-back signal from the delayed output sum of the third summation 550. The delay being applied by second delay 560 which applies a delay of Delay2. The output sum from the second summation 530 is fed-forward to the third summation 550 via first multiplier 540, which applies a factor k1. The delayed output sum from the second delay 560 is also coupled to the fourth summation 570 wherein it is combined with a multiplication of the input signal which is multiplied as received before the first summation circuit 520. The multiplication is performed by second multiplier 510 which applies a factor k2. The output signal provided to the output port 500B is given by Equation 9 below:

$$\text{Output} = \text{Delay3} + (k2 * \text{Input})) \quad (9)$$

where A=Input−(k2*Output)), B=Delay1+(k1*(A−Delay2)), Delay1=B, and Delay2=Delay3=B.

In operation the second delay 560 within second-order all-pass filter 500 replaces the second and third delays 480 and 460, respectively, within the second-order all-pass filter 400. As such one delay is removed from the operation of the DSP in implementing the second-order all-pass filter 500. The second-order all-pass filter 500 has exactly the same transfer function and coefficient mapping as second order all-pass filter 300 whilst requiring one fewer multiplication. Further it is also insensitive to coefficient quantization effects for k1, the parameter which controls pole frequency, a property that second order all-pass filter 300 does not possess, This arises as k1 is only used in one multiplication, and the resulting product will only be quantized once and used in both the feed-forward and feed-back paths, whereas second-order all-pass lattice filter 300 uses k1 in two multiplication operations at different points in the signal path and the feed-forward and feed-back paths are now no longer guaranteed to have exactly equal gain after quantization of the multiplication results. This can result therefore in pole frequency deviations from the expected pole location. Advantageously therefore, the embodiment maintains the coefficients in lattice form thereby giving independent control of the pole frequency and pole radius. Further, the embodiment allows for reduced gain at internal nodes which benefits fixed point implementations.

Figure 6:
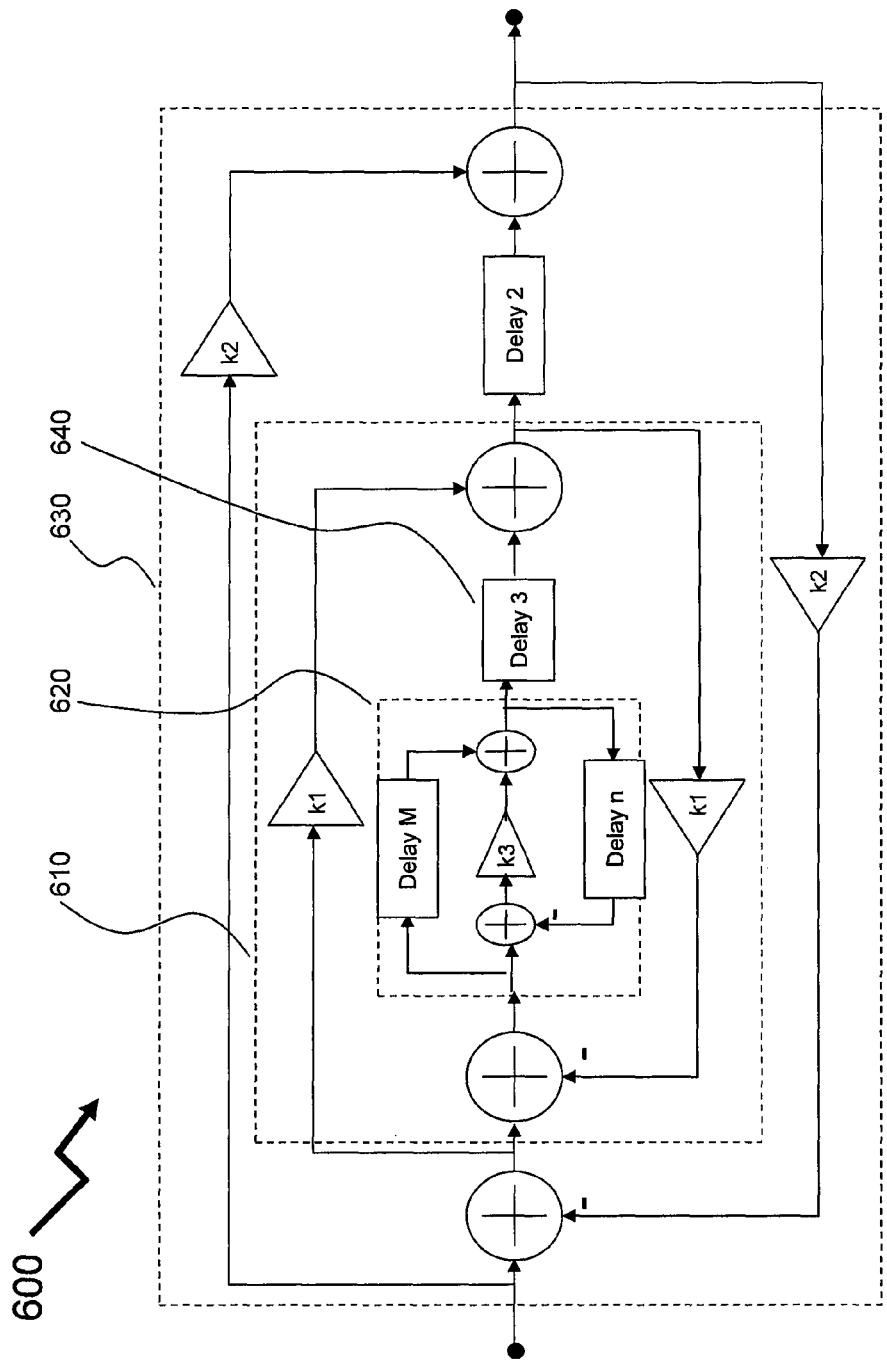
FIG. 6 is a block diagram of an embodiment of the invention applied to construction of a higher order filter.

Referring to FIG. 6 there is shown a block diagram of an embodiment of the invention applied to construction of a higher order filter 600. As shown higher order filer 600 comprises a three-level nesting of all-pass filters, being inner all-pass filter 620, intermediary all-pass filter 610 and outer all-pass filter 630. As depicted outer all-pass filter 630 and intermediary all-pass filter 610 are TDF2-like all-pass filters, such as depicted as first TDF2-like first order all-pass filter 301 with factor k2 and second TDF2-like first order all-pass filter 302 with factor k1. The inner all-pass filter 620 is also a first order all-pass filter, such as depicted in FIG. 1 by DF1-like first order all-pass filter 100 with factor k3, the output port of which is coupled to a unit Delay 3 640. Unit Delay 640 providing a delay of 1 sample time. Accordingly the higher order filter 600 again supports saving of one delay similar to the savings discussed with reference to FIG. 5 by replacing Delay 3 and Delay n with a single delay block.

Figure 7:
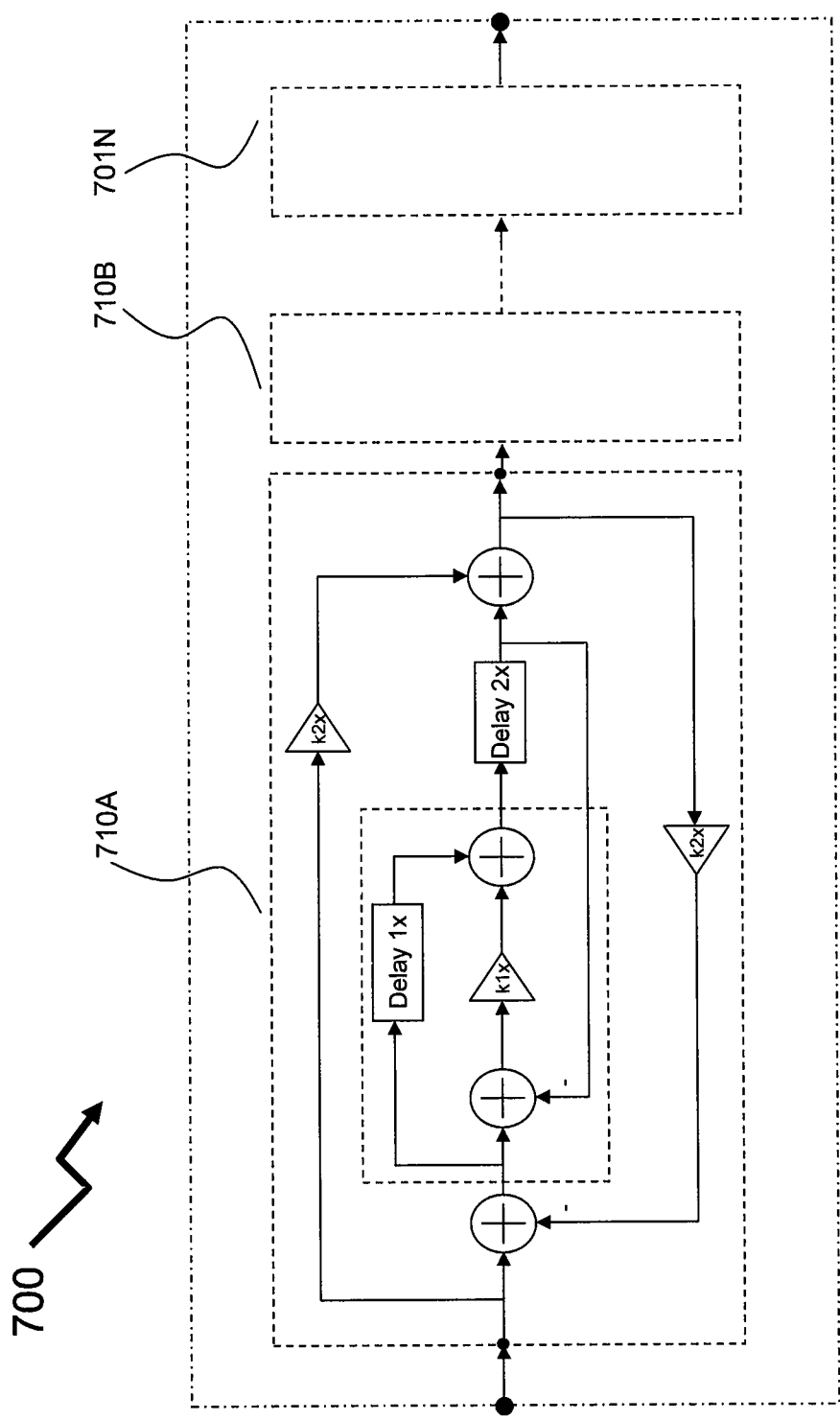
FIG. 7 is a block diagram of an embodiment of the invention for an all-pass filter giving independent control of the pole frequencies and radii of the multiple independent poles.

Now referring to FIG. 7 there is shown a block diagram of an embodiment of the invention for an all-pass filter 700. All-pass filter 700 comprises a cascade of second-order all-pass filters 700A, 700B through to 700N. Each second order all-pass filter 700A, 700B through to 700N shown as second-order all-pass filter 500 from FIG. 5 supra. The all-pass filter 700 provides for independent control of the pole frequencies and radii of the multiple independent poles, which is equivalent of factoring the overall all-pass transfer function into multiple second order product terms. This typically allows better control of numerical errors in fixed point implementations.

Whilst the embodiment presented decomposes a direct form first-order all-pass filter within a transposed direct form second-order all-pass filter it would be apparent to one skilled in the art that the approach is extensible to higher order filters allowing the removal of additional delay stages, thereby enhancing DSP performance further.

Numerous other embodiments may be envisaged without departing from the spirit or scope of the invention.

What is claimed is:

1. A digital all pass filter of at least the second order, comprising:
    a first filter of the first order nested within a second filter of the first order;
    the first filter comprising:
    a first subtractor having a plus input providing an input to the first filter and a minus input;
    a first summer having first and second inputs and output providing an output of the first filter; and
    a first multiplier coupled between the output of the first subtractor and the first input of the first summer; and
    a feedforward first delay element coupled between the plus input of the first subtractor and the second input of the first summer; and
    the second filter comprising:
    a second subtractor having a plus input providing an input to the second filter and a minus input;
    a second summer having first and second inputs and an output providing an output of the second filter;
    a second delay element having an output coupled to the first input of the second summer and an input;
    a feedforward second multiplier coupled between the first input of the second subtractor and the second input of the second summer;

a feedback third multiplier between the output of the second summer and the minus input of the second subtractor; and said first filter being coupled between the output of the second summer and the input of the second delay element; and a feedback loop between the output of the second delay element and the minus input of the first subtractor.

2. A digital all pass filter as claimed in claim 1, wherein the first and second filters are nested with a third filter to provide a filter of order greater than 2.

* * * * *